(12) United States Patent
Ali (10) Patent No.: US 7,279,986 B2
(45) Date of Patent: Oct. 9, 2007

(54) BUFFER AMPLIFIERS WITH ENHANCED EFFICIENCY (75) Inventor: Ahmed Mohamed Abdelatty Ali, Greensboro, NC (US)

(73) Assignee: Analog Devices, Inc., Norwood, MA (US)

( * ) Notice: Subject to any disclaimer, the term of this patent is extended or adjusted under 35 U.S.C. 154(b) by 189 days.

(21) Appl. No.: 11/176,119

(22) Filed: Jul. 6, 2005

(65) Prior Publication Data
US 2006/0261900 A1 Nov. 23, 2006

Related U.S. Application Data (60) Provisional application No. 60/683,959, filed on May 23, 2005.

(51) Int. Cl.
*H03F 1/22* (2006.01)
(52) U.S. Cl. ..................................................... 330/311
(58) Field of Classification Search ................ 330/311, 330/300
See application file for complete search history.

(56) References Cited

U.S. PATENT DOCUMENTS 3,737,797 A * 6/1973 Amemiya .................. 330/261

| 6,384,758 | B1 | 5/2002 | Michalski et al. ........... 341/122 |
| 6,650,263 | B1 | 11/2003 | Dillon ........................ 341/122 |
| 6,727,729 | B2 | 4/2004 | Brooks et al. ................ 326/68 |
| 6,778,013 | B1 | 8/2004 | Ali ............................. 330/252 |
| 6,859,159 | B2 | 2/2005 | Michalski ................... 341/172 |
| 7,157,955 | B2 * | 1/2007 | Wei ............................ 327/337 |
| 2006/0119435 | A1 * | 6/2006 | Oh et al. .................... 330/311 |

OTHER PUBLICATIONS

Berberich, Katharina, et al., "Fully Differential Amplifier Maximizes Fast ADC Potential", ECE magazine, Feb. 2005, pp. 39-41.
Swager, Anne, "Evolving ADCs Demand More from Drive Amplifiers", EDN magazine, Sep. 29, 1994, 6 pages.

* cited by examiner

*Primary Examiner*—Benny Lee
*Assistant Examiner*—Alan Wong
(74) *Attorney, Agent, or Firm*—Koppel, Patrick, Heybl & Dawson (57) ABSTRACT

Buffer amplifiers are provided that demonstrate enhanced efficiency because they include current sources which are configured to be switched off during operational modes in which the amplifiers' output signals are not needed. Amplifier embodiments include charge-transfer transistors and filter capacitors that reduce spurious signals which may be generated by the switching operations.

20 Claims, 5 Drawing Sheets

BUFFER AMPLIFIERS WITH ENHANCED EFFICIENCY

CROSS REFERENCES TO RELATED APPLICATIONS

This application claims the benefit of U.S. Provisional Application Ser. No. 60/683,959 filed May 23, 2005.

BACKGROUND OF THE INVENTION

1. Field of the Invention

The present invention relates generally to buffer amplifier systems.

2. Description of the Related Art

Buffer amplifiers are generally inserted into signal processing systems to provide isolation between system circuits. To enhance this isolation, an ideal voltage buffer has infinite input impedance, zero output impedance, and infinite bandwidth. Real buffer amplifiers attempt to meet these ideal operational parameters.

A common buffer amplifier function is to supply a load current while maintaining a fixed voltage (i.e., maintaining a low output impedance). Nonlinearity is a measure of the extent to which the buffer amplifier fails this function and this nonlinearity typically generates signal distortions which increase with increased signal frequency and increased load currents.

Although bias currents of buffer amplifiers are often increased to reduce signal distortions that result from the need to provide high load currents, this action degrades buffer amplifier efficiencies.

BRIEF SUMMARY OF THE INVENTION

The present invention is directed to buffer amplifiers that provide enhanced efficiency. The novel features of the invention are set forth with particularity in the appended claims. The invention will be best understood from the following description when read in conjunction with the accompanying drawings.

DETAILED DESCRIPTION OF THE INVENTION

Buffer amplifier embodiments of the present invention generally position one or more transistor followers along an amplifier signal path. Because the transfer voltage between the control and lower current terminals of these followers is thus on the signal path, the amplifier embodiments are configured to maintain substantially-constant currents through these followers so that the transfer voltage is also substantially constant. However, it is also realized that this substantially-constant current need only be provided during active portions of the buffer amplifiers' operation and that amplifier efficiency can be significantly enhanced by terminating the current in non-active portions of that operation.

Figure 1A:
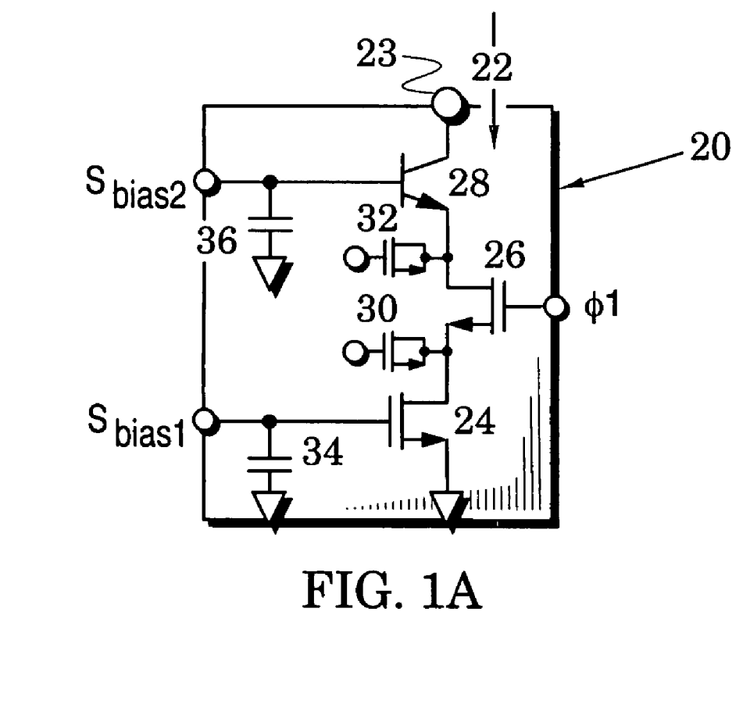
FIGS. 1A and 1B are schematics that illustrate current source system embodiments of the present invention.
Figure 1B:
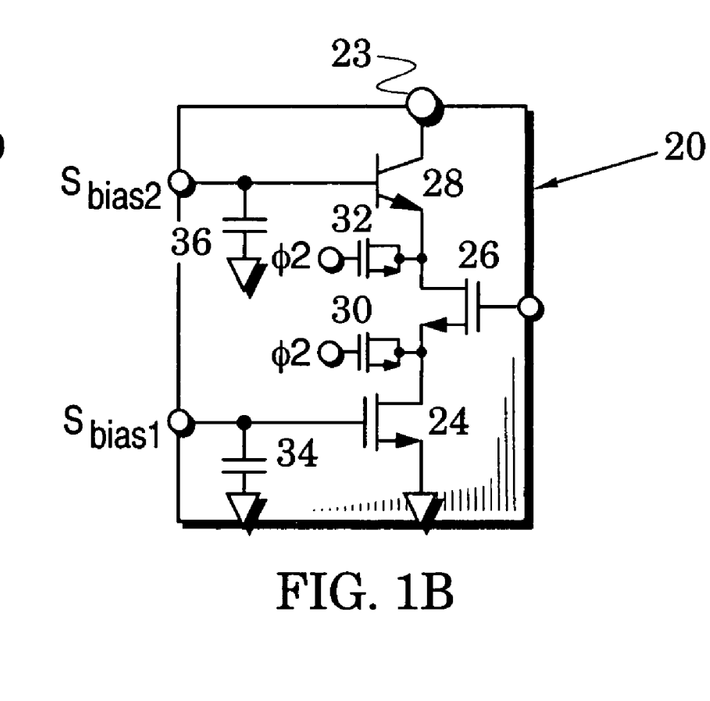

FIGS. 1A and 1B illustrate a current source system embodiment 20 which provides a system current 22 at a system port 23 in response to a first mode-command signal and which, in absence of the first mode-command signal, conserves energy by terminating the system current 22.

The system 20 includes a current transistor 24, a switch transistor 26, and a cascode transistor 28. As shown, the switch transistor is positioned between the current transistor and the cascode transistor so that, in response to the first mode-command signal, it couples them together to thereby provide the system current 22 and, in absence of the first mode-command signal, it isolates the current transistor from the cascode transistor to thereby terminate the system current 22. The current transistor and cascode transistor are biased on by bias signals $S_{bias1}$ and $S_{bias2}$ so that, when coupled together by the switch transistor, the current transistor generates the system current 22 and the cascode transistor provides a significantly-increased output impedance at the system port 23.

In particular, FIG. 1A shows the first mode-command signal (shown in the form of a first phase $\phi 1$ which might, for example, be a clock signal) applied to the control terminal (i.e., gate) of the switch transistor 26. This signal turns on the switch transistor 26 and initiates the system current at the system port 23. In FIG. 1B, the first mode-command signal is no longer present at the control terminal of the switch transistor 26. Removal of this signal turns the switch transistor off and terminates the system current that previously issued from the system port 23.

Although in some system embodiments, the amplitude of the first mode-command signal can be selected so that the switch transistor 26 operates in its saturation region, the amplitude is preferably selected so that this transistor operates in its triode region. In that operational region, the switch transistor functions as a small linear resistor so that the system current 22 generates a substantially reduced voltage drop as it passes through the switch transistor. The current source system 20 is thus particularly suitable for use in networks that have limited headroom.

In a system embodiment, the switch transistor 26 is a metal-oxide-semiconductor (MOS) transistor. When this transistor is turned on by the first mode-command signal $\phi 1$, an inversion-layer channel is formed beneath its control terminal and an electronic charge is stored in this channel wherein the charge is proportional to the size of the channel. When the first mode-command signal $\phi 1$ is removed, the channel disappears as the stored charge exits the switch transistor's current terminals. At least a portion of this charge may be directed through the system port 23 where it may degrade the operation of a network that is intended to receive the system current 23.

In a feature of the system 20, charge-transfer transistors 30 and 32 are respectively coupled to first and second current terminals (i.e., source and drain) of the switch transistor 26. Each of the charge-transfer transistors has first and second current terminals (i.e., source and drain) and these are both preferably coupled to a respective one of the first and second current terminals of the switch transistor.

As seen in FIG. 1B, a second mode-command signal (shown in the form of a first phase $\phi 2$) is applied to the control terminals (i.e., gates) of the charge-transfer transistors 30 and 32. It is preferably applied approximately at the time that the first mode-command signal φ1 is removed from the gate of the switch transistor 26. Initiation of the second mode-command signal φ2 forms inversion-layer channels in the charge-transfer transistors 30 and 32 and these channels also contain stored electronic charge. At least a portion of this stored charge is thus the charge that exited the current terminals of the switch transistor 26 when the first mode-command signal φ1 was removed.

In a system embodiment, the charge-transfer transistors 30 and 32 are sized so that each of their channels is approximately one half the size of the channel of the switch transistor 26. Therefore, the stored charge is substantially constant during the first and second mode-command signals φ1 and φ2 as it is essentially transferred back and forth between the switch transistor and the charge-transfer transistors. Accordingly, charges exiting the system port 23 are substantially reduced and, operational performance is substantially enhanced in a network that receives the system current 23.

Rapid application of the first mode-command signal φ1 will inevitably cause a reduced version of this signal to reach and exit the system port 23 as "clock feedthrough" spurious signals which can also degrade the operation of a network that is intended to receive the system current 23. In another feature of the system 20, filter capacitor 34 is coupled to the control terminal of the current transistor 24 and filter capacitor 36 is coupled to the control terminal of the cascode transistor 28. These filter capacitors act to decouple spurious signals from these control terminals and substantially block their passage through the system port 23.

It is noted that the bias signals $S_{bias1}$ and $S_{bias2}$ are preferably maintained at constant levels so that the current source system 20 rapidly changes between its first operational mode during which it provides the system current 22 and its second operational mode during which it terminates the system current 22. These bias signals may be generated by various bias circuits.

Figure 2A:
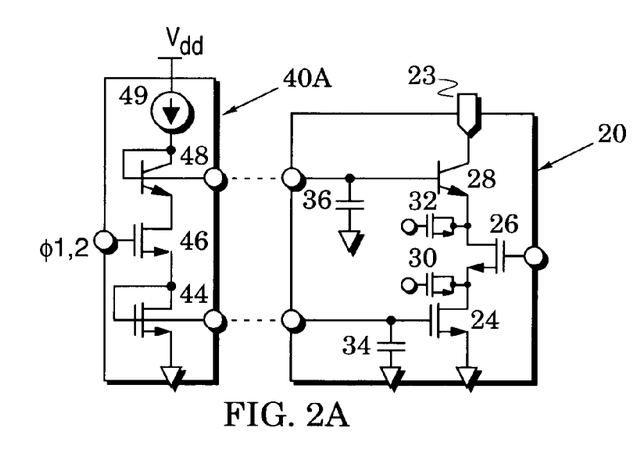
FIGS. 2A-2C are schematics that illustrate bias generator embodiments for use in the current source embodiment of FIGS. 1A and 1B.

For example, FIG. 2A shows the current source system 20 receiving bias signals from a bias generator 40A that includes first and second diode-coupled transistors 44 and 48 that are coupled together by a switch transistor 46 which is always biased on (this constant-on bias is indicated by the presence of first and second mode-command signals φ1 and φ2 at the control terminal of the switch transistor 44). A current source 49 is coupled to drive current through the second diode-coupled transistor 48, the switch transistor 46, and the first diode-coupled transistor 44. The bias signals are provided by the control terminals of the first and second diode-coupled transistors 44 and 48.

Figure 2B:
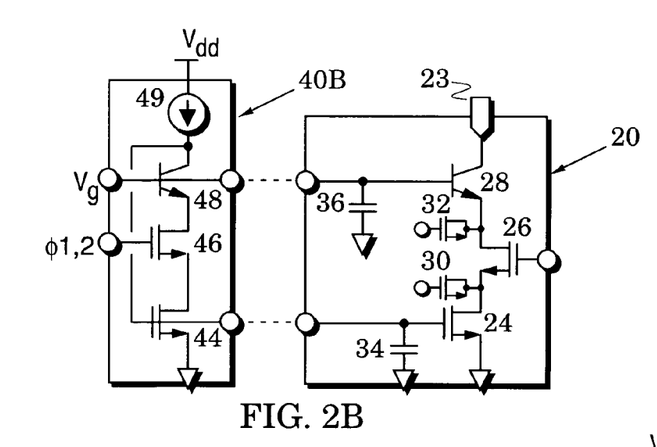

For another example, FIG. 2B is similar to the bias generator 40A of FIG. 2A with like elements indicated by like reference numbers. In the bias generator 40B, however, the transistors 44 and 48 are no longer diode-coupled but, rather, the control terminal of transistor 44 is coupled to the upper current terminal of the transistor 48. In this bias arrangement, a control-terminal voltage is applied to the control terminal of the transistor 48 that is just sufficient to place transistor 44 in its saturation region. The headroom required by this bias generator has thus been substantially reduced.

Figure 2C:
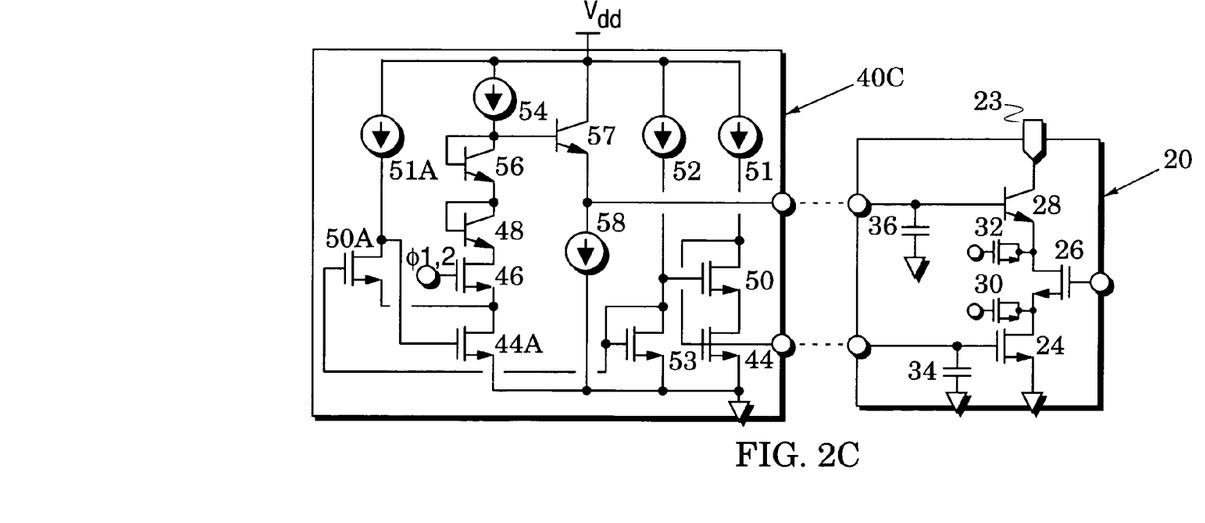

For another example, FIG. 2C shows the current source system 20 receiving bias signals from a bias generator 40C that has the transistor 44 of FIG. 2B and a compression transistor 50 coupled to receive the current of a current source 51. The compression transistor is arranged in cascode with transistor 44 but with the control terminal of transistor 44 coupled to the upper current terminal of the cascode transistor and also coupled to the control terminal of the current transistor 24.

The control terminal of the compression transistor 50 receives bias from a diode-coupled transistor 53 that receives current from a current source 52. This arrangement compresses the bias of transistor 44 so that it is just sufficient to place this transistor (and hence, the current transistor 24) in its saturation region. To reduce current demand, transistors 44, 50 and 53 are preferably scaled-down versions of the current transistor 24 with the current of current sources 51 and 52 reduced so that all transistors operate with substantially-equal current densities.

In a bias generator embodiment, the stacked transistors 46 and 48 of FIG. 2A could be stacked above the upper current terminal of transistor 44 to provide the bias signal $S_{bias2}$ for the cascode transistor 28. The embodiment shown in FIG. 2C further enhances bias accuracy by duplicating transistors 44 and 50 and their current source 51 as transistor 44A, compression transistor 50A and current source 51A and then stacking switch transistor 46 and diode-coupled transistor 48 above the upper current terminal of transistor 44A.

To further enhance isolation, a follower transistor 57 and an associated current source 58 is preferably inserted to deliver the bias signal $S_{bias2}$ to the cascode transistor 28. To counter the voltage drop of this follower transistor, a diode-coupled transistor 56 is inserted between it and the diode-coupled transistor 48.

Figures 3A, 3B, 4:
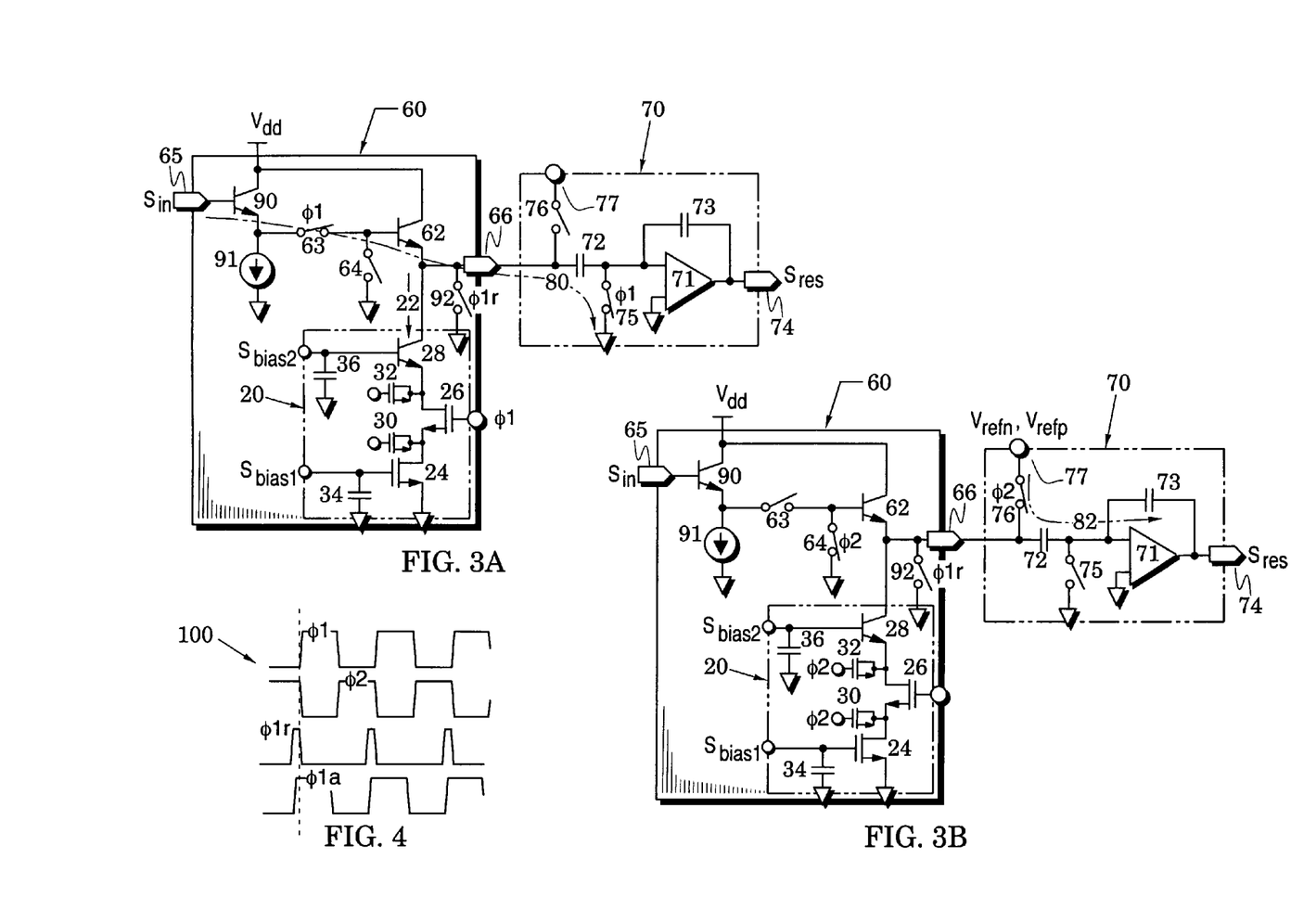
FIGS. 3A and 3B are schematics that illustrate buffer amplifier embodiments which include the current source embodiments of FIGS. 1A and 1B.
FIG. 4 is a timing diagram that illustrates switch timing in the amplifier of FIGS. 3A and 3B.

The current source systems of the present invention can effectively enhance the efficiency of any network that is active during one operational mode and inactive during a different operational mode. For example FIGS. 3A and 3B illustrate a buffer amplifier 60 that includes a transistor follower 62, a first series buffer switch 63, a second shunt buffer switch 64, and the current source system 20 that was shown in FIGS. 1A and 1B. The transistor follower 60 has a follower control terminal (i.e., base) coupled to receive analog input signals $S_{in}$ from a buffer input port 65, via the series switch 64, and has a follower current terminal (i.e., emitter) coupled to provide analog output samples to a buffer port 66.

The buffer amplifier 60 is particularly suited for providing samples of the analog input signal $S_{in}$ to networks that have first and second operational modes such as the switched-capacitor network 70 which is often referred to as a multiplying digital-to-analog converter (MDAC). As shown in FIGS. 3A and 3B, the network 70 includes an amplifier 71 coupled to a network output port 74, a first capacitor 72 coupled between an inverting port of the amplifier and the buffer port 66, and a second capacitor 73 coupled between the inverting port and the network output port 74.

A first network switch 75 couples the amplifier inverting port to ground so that, when this network switch is closed in FIG. 3A, it establishes a signal path 80 through the transistor follower 62 and through the first capacitor 72. A second network switch 76 is coupled to an upstream side of the first capacitor 72 to permit application of decision signals that are received at a network port 77 in FIG. 3B. The decision signals may, for example, be negative and positive reference signals $V_{refn}$ and $V_{refp}$ that define the range of a signal converter that is associated with the switched-capacitor network 70 and that also processes signals received from the buffer port 66. When the second network switch 76 is closed in FIG. 3B, it establishes a signal path 82 from the network port 77 through the first and second capacitors 72 and 73.

FIG. 3A shows that, in response to a first mode-command signal (shown in the form of a first phase φ1) the switch transistor 26 turns on and the first buffer switch 63 and the first network switch 75 close to establish the signal path 80 which facilitates charging of the first capacitor 72 to the current value of the analog input signal $S_{in}$. During this first command signal, the current source system 20 provides a system current 22 sufficient for operation of the transistor follower 62 so that it provides a sample of the analog input signal at the buffer port 66.

FIG. 3B shows that, in response to a second mode-command signal (shown in the form of a second phase φ2) and removal of the first mode-command signal, the first buffer switch 63 and the first network switch 75 open to thereby capture the sample of the input signal $S_{in}$ on the first capacitor 72. At the same time, the switch transistor 26 turns off so that the system current 22 is terminated and the second buffer switch 64 closes to remove bias and thereby insure that the transistor follower 62 is turned off.

In addition, the second network switch 76 turns on to establish the signal path 82 which transfers charge from the first network capacitor 72 to the second network capacitor 73. Because the input impedance and the gain of the amplifier 71 are quite high, substantially all of the charge is diverted past the input of the amplifier 71 and it flows into the second network capacitor 73 to thereby enhance the accuracy of the charge transfer.

The amount of charge transferred is conditioned by the decision signals that are presented to the network port 77. The transferred charge generates a residue signal $S_{res}$ at the network port 74. Subsequent removal of the second mode-command signal φ2 and application of the first mode-command signal φ1 initiates a repeat of the operations described above with subsequent appearance of an updated residue signal $S_{res}$ at the network port 74.

Terminating the system current 22 during durations of the second mode-command signal φ2 (i.e., during establishment of the signal path 82) substantially enhances efficiency of the buffer amplifier 60. For example, the efficiency increase is on the order of 50% when the durations of the first and second mode-command signals is substantially equal. In addition, it has been found that the efficiency enhancement is gained with minimal degradation of buffer parameters (e.g., minimal degradation in accuracy of the samples obtained at the buffer port 66 or of the residue signals $S_{res}$ obtained at the network port 74).

It is noted that there is a transfer voltage between the control terminal and the lower current terminal of the transistor follower 62 so that the voltage of a sample at the buffer port 62 "follows" the voltage at the input port 65. To further enhance the accuracy of the samples of the analog input signal that are captured at the buffer port 66, the current through the transistor follower 62 should remain substantially constant so that the transfer voltage also remains substantially constant. Since this transfer voltage is on the signal path 80 of FIG. 3A, the accuracy of the samples captured at the buffer port 66 will be degraded if it varies (e.g., varies with input signal amplitude).

One method for reducing variation of this transfer voltage is to increase the magnitude of the system current 22 in FIG. 3A so that the magnitude of the signal currents through the buffer port 66 are small relative to that of the system current 22. Since the current through the transistor follower 62 is then substantially that of the system current 22, there will be little change in the transfer voltage across the follower. The embodiments of the invention facilitate use of this method because they substantially enhance buffer efficiency and more than offset the loss of efficiency that results from increasing the magnitude of the system current 22.

In another embodiment, the buffer amplifier of FIGS. 3A and 3B is augmented by the upstream insertion of a second transistor follower 90 along with a corresponding current source 91. The control terminal of this transistor follower is coupled to the input port 63 to receive the analog input signal $S_{in}$ and its current terminal is coupled to the second buffer switch 64 and the current source 91. This additional transistor follower provides further isolation between upstream circuits (that generate the analog input signal $S_{in}$) and the switched-capacitor network 70. For example, it reduces spurious signals that might otherwise be injected into systems that generate the analog input signal $S_{in}$.

FIGS. 3A and 3B show that yet another amplifier embodiment is formed by the addition of a reset switch 92 which is coupled to the buffer port 66. Operation of this reset switch can be described with aid of the timing graph 100 of FIG. 4. In the timing embodiment of this graph, the first and second mode-command signals φ1 and φ2 occur with 50% duty cycles that are shifted 180° relative to each other.

When the second network switch 76 is closed during the second mode-command signal φ2, the upstream plate of the first network capacitor 72 may be charged up to a positive voltage (e.g., $V_{refp}$). At initiation of a succeeding first mode-command signal φ1, the transistor follower 62 must initially provide a discharge current that is sufficient to eliminate this capacitor charge. This discharge current momentarily alters the currents through the transistor follower 62 which may introduce an undesirable error component into the transfer voltage between the transistor follower's control and current terminals. Even if the discharge current does not introduce an error component, the efficiency of the buffer amplifier 60 is degraded because it has to provide the discharge current.

The reset switch 92, however, responds to a short reset signal φ1r (i.e., a third mode-command signal) that is positioned to slightly precede the first mode-command signal φ1 as shown in the graph 100. Charges on the first network capacitor 72 are thus quickly removed via a discharge path through the reset switch prior to turn on of the transistor follower 62. Accordingly, the efficiency of the transistor follower 62 is enhanced because it no longer provides this discharge current. The reset switch is shown in its open state in FIGS. 3A and 3B since these figures depict operations during the main portions of the first and second mode-command signals.

For another embodiment, the graph 100 also shows an advance signal φ1a that is similar to the first mode-command signal φ1 but which slightly precedes this signal. Preferably, the second network switch 75 in FIGS. 3A and 3B is altered to respond to this advance signal and captures an accurate sample on the first network capacitor 72 just prior to initiation of switching of other upstream switches (e.g., the first and second buffer switches 63 and 64) which may inject switching transients that could degrade the sample accuracy.

Buffer amplifier embodiments of the invention may be supplemented with replica generators that are configured to further stabilize the current through the transistor follower 62 and thereby further stabilize the voltage transfer across the follower.

Figure 5:
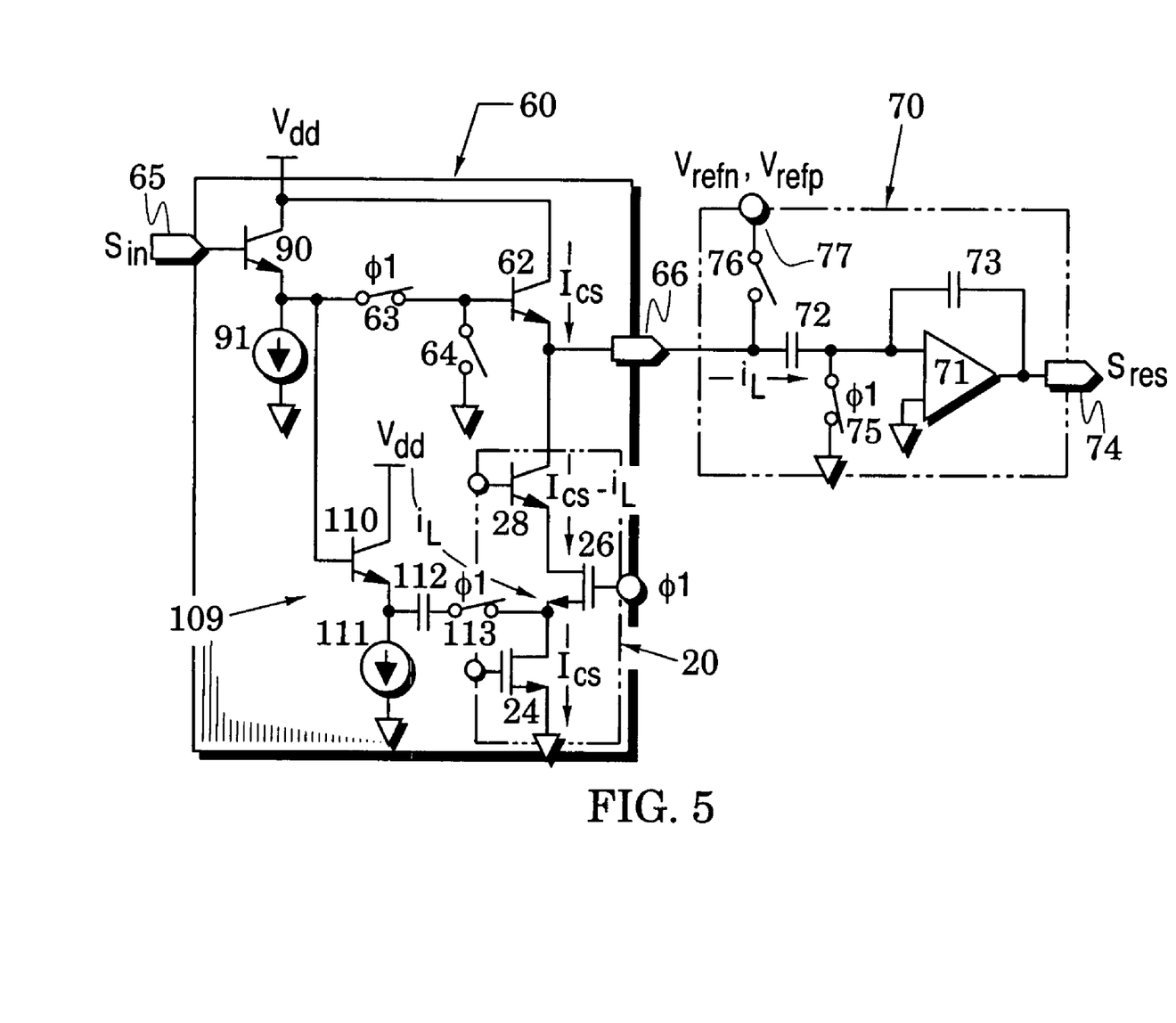
FIG. 5 is a schematic similar those of FIGS. 3A and 3B which illustrates an added replica generator.

For example, FIG. 5 is similar to FIG. 3A (with like elements indicated by like reference numbers) but also inserts a replica generator 109 that includes an arrangement of a replica transistor follower 110, a replica current source 111 and a replica switch 113 that mimics the arrangement of the second transistor follower 90, current source 91 and first buffer switch 63. The replica generator also includes a replica capacitor 112 that mimics the first network capacitor 72 and that is placed in series with the replica switch 113. The replica generator 109 is coupled to provide current to the current transistor 24 in response to the analog input signal $S_{in}$.

In FIG. 5, it is assumed that the current transistor 24 provides a current-source current $I_{cs}$ (essentially the system current 22 of FIGS. 1A and 1B). In operation of the buffer amplifier 60, the transistor follower 62 drives a load current $i_L$ through the first network capacitor 72 (along the signal path 80 of FIG. 3A). The replica generator 109 is configured with similar elements so that the replica transistor follower 110 drives a similar load current $i_L$ through the replica capacitor 112 and the current transistor 24.

Accordingly, the current through the cascode transistor 28 is $I_{cs}$-$i_L$ and the current through the transistor follower 62 reduces to the current-source current $I_{cs}$. The replica generator 109 thus provides a replica current to the current transistor 24 so that the current through the transistor follower 62 is substantially constant. This substantially-constant current insures that the voltage transfer across the control and current terminals of the transistor follower is also substantially constant and this enhances the accuracy of the sample that is captured at the buffer port 66.

Figure 6:
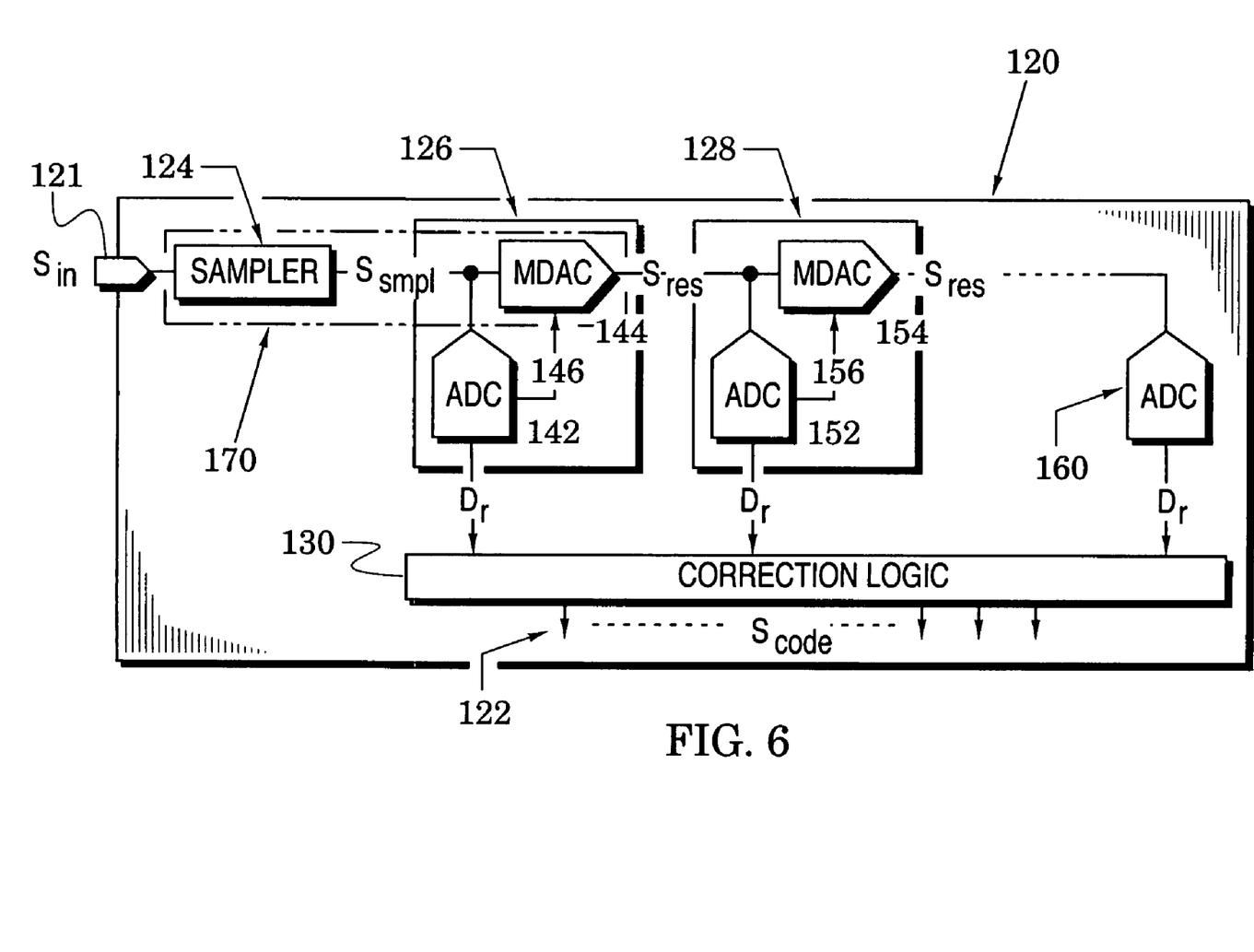
FIG. 6 is a block diagram of a pipelined signal converter that includes buffer amplifier embodiments of the invention.

The buffer amplifier structures of the present invention can be advantageously used in a variety of signal conditioning systems such as the pipelined analog-to-digital converter 120 of FIG. 6. The converter 120 includes a sampler 124, an initial converter stage 126 and at least one successive converter stage 128 and converts an analog input signal $S_{in}$ at an input port 121 to a corresponding digital code signal $S_{code}$ at an output port 122. The conversion is accomplished by successive (i.e., pipelined) conversions in the successive converter stages.

In particular, the sampler 124 provides a sample signal $S_{smpl}$ in response to the input signal $S_{in}$ and the initial converter stage 106 processes the sample signal $S_{smpl}$ to provide a residue signal $S_{res}$ and also provide respective digital bits $D_r$. In a similar fashion, each successive converter stage 108 processes a preceding residue signal $S_{res}$ to provide a successive residue signal $S_{res}$ and also provide respective digital bits $D_r$. However, the final one of the successive converter stages only provides respective digital bits $D_r$ as it has no need to provide a residue signal. The converter stages of the pipelined converter 120 are generally configured to provide extra digital bits so that the pipelined converter can include a correction logic 130 which corrects processing errors and generates the digital code signal $S_{code}$.

The initial converter stage 106 typically has an initial converter 142 (e.g., a flash ADC) that converts the sample signal $S_{smpl}$ to respective digital bits $D_r$. The initial converter stage also has a multiplying digital-to-analog converter (MDAC) 144 that receives the sample signal $S_{smpl}$ and also receives a decision signal 146 from the initial converter 142. The decision signal indicates which of possible digital bits $D_r$ is being provided at any given moment by the initial converter 142. Exemplary decision signals are the negative and positive reference signals $V_{refn}$ and $V_{refp}$ that shown at the network port 77 in FIG. 3B. In response to the sample signal $S_{smpl}$ and the decision signal 146, the MDAC 144 provides a residue signal $S_{res}$ for processing by the successive converter stage 128.

The successive converter stages 128 processes the residue signal $S_{res}$ of the preceding stage and is configured similarly to the initial converter stage 106. For example, it has a successive converter 152 and an MDAC 154 that receives a decision signal 156 from the successive converter 152. In contrast, the final converter stage is formed with just a respective converter 160.

In FIG. 6, a signal capturer and processor 170 is indicated by a broken-line box that includes the sampler 124 and the MDAC 144. In a system embodiment, the signal capturer and processor 170 is essentially the buffer amplifier 60 and switched-capacitor network 70 illustrated in FIGS. 3A and 3B wherein the decision signals at the network port 77 in FIG. 3B are the decision signals 146 in FIG. 6. The efficiency of the buffer amplifier 60 significantly enhances the usefulness of the pipelined converter 120 of FIG. 6.

Although embodiments of the invention have been described with combinations of specific transistor types, other embodiments may include different combinations. For example, illustrated bipolar junction transistors can be replaced with metal-oxide-semiconductor transistors and illustrated metal-oxide-semiconductor transistors can be replaced by bipolar junction transistors.

For a second example, the transistor follower 62 is shown as an emitter follower in FIGS. 3A and 3B but, in other amplifier embodiments, it can be realized as a source follower. It was mentioned above that the transistor follower 62 has a voltage transfer between its control and lower current terminals. When the transistor follower 62 is a bipolar junction transistor, its transfer voltage is $V_{be}$.

The first and second buffer switches 63 and 64, first and second network switches 75 and 76 and reset switch 92 of FIGS. 3A and 3B are preferably realized with transistors (e.g., metal-oxide-semiconductor transistors).

It is noted that the word mimic has been used above to indicate that selected elements resemble or closely imitate other elements.

It is further noted that single-ended embodiments of buffer amplifiers have been described above for to enhance clarity of illustration. Differential buffer embodiments easily follow from these descriptions and are considered to be included in the embodiments of the invention. In differential buffer embodiments, the circuit grounds shown in figures such as FIGS. 3A and 3B may be replaced with a common-mode signal level. The reset switch 92 may be referenced to the common-mode signal level or to a more-negative signal (e.g., $V_{refn}$).

The embodiments of the invention described herein are exemplary and numerous modifications, variations and rearrangements can be readily envisioned to achieve substantially equivalent results, all of which are intended to be embraced within the spirit and scope of the invention as defined in the appended claims.

I claim:

1. A current source system that responds to at least one mode-command signal, comprising:
   a current transistor;
   a cascode transistor; and
   a switch transistor positioned to couple said current transistor and said cascode transistor together in response to a mode-command signal to thereby provide a system current with said cascode transistor and to isolate said current transistor from said cascode transistor in response to absence of said mode-command signal;
   wherein said current transistor and said cascode transistor respectively have a current control terminal and a cascode control terminal and further including first and second capacitors respectively coupled to said current control terminal and said cascode control terminal to reduce feedthrough of said mode-command signal onto said system current.

2. The system of claim 1, wherein said cascode transistor has first and second cascode current terminals with said second cascode current terminal coupled to said switch transistor and further including a reset switch coupled to said first cascode current terminal to respond to a second mode-command signal that precedes said mode-command signal wherein said reset switch thereby provides a discharge oath for circuits coupled to said first cascode current terminal.

3. A current source system that responds to at least one mode-command signal, comprising:
 a current transistor;
 a cascode transistor; and
 a switch transistor positioned to couple said current transistor and said cascode transistor together in response to a mode-command signal to thereby provide a system current with said cascode transistor and to isolate said current transistor from said cascode transistor in response to absence of said mode-command signal;
 wherein said switch transistor has first and second switch current terminals and further including first and second charge-exchange transistors respectively coupled to said first and second switch current terminals for activation by a second mode-command signal.

4. The system of claim 3, wherein said first and second charge-exchange transistors each have first and second charge-exchange current terminals that are coupled to their respective one of said first and second switch current terminals.

5. A current source system that responds to at least one mode-command signal, comprising:
 a current transistor;
 a cascode transistor; and
 a switch transistor positioned to couple said current transistor and said cascode transistor together in response to a mode-command signal to thereby provide a system current with said cascode transistor and to isolate said current transistor from said cascode transistor in response to absence of said mode-command signal;
 wherein said current transistor and said cascode transistor respectively have a current control terminal and a cascode control terminal and further including a cascode bias system configured to provide bias signals to said current control terminal and said cascode control terminal.

6. A buffer amplifier that processes signals along a signal path in response to at least one mode-command signal, comprising:
 a follower transistor having a follower control terminal and a follower current terminal;
 a current transistor;
 a cascode transistor coupled to said follower current terminal; and
 a switch transistor positioned to couple said current transistor and said cascode transistor together in response to a mode-command signal to thereby provide a follower current with said cascode transistor and positioned to isolate said current transistor from said cascode transistor in absence of said mode-command signal;
 said follower control terminal and follower current terminal thereby defining at least a portion of said signal path during said mode-command signal.

7. The amplifier of claim 6, wherein said current transistor and said cascode transistor respectively have a current control terminal and a cascode control terminal and further including first and second capacitors respectively coupled to said current control terminal and said cascode control terminal to reduce feedthrough of said mode-command signal onto said follower current.

8. The amplifier of claim 6, wherein said switch transistor has first and second switch current terminals and further including first and second charge-exchange transistors respectively coupled to said first and second switch current terminals and activated by a second mode-command signal.

9. The amplifier of claim 8, wherein said first and second charge-exchange transistors each have first and second charge-exchange current terminals that are coupled to their respective one of said first and second switch current terminals.

10. The amplifier of claim 6, wherein said current transistor and said cascode transistor respectively have a current control terminal and a cascode control terminal and further including a cascode bias system configured to provide bias signals to said current control terminal and said cascode control terminal.

11. The amplifier of claim 6, further including a first switch coupled to said follower control terminal to turn off said follower transistor in response to a second mode-command signal.

12. The amplifier of claim 11, further including a second switch coupled to said follower control terminal to extend said signal path in response to said mode-command signal and block said signal path in response to absence of said mode-command signal.

13. The amplifier of claim 12, wherein said first and second switches are transistors.

14. The amplifier of claim 6, further including:
 a first network switch that closes in response to said mode-command signal;
 a load capacitor coupled between said follower current terminal and said first network switch; and
 a second network switch coupled to said follower current terminal and responding to a second mode-command signal.

15. The amplifier of claim 6, further including:
 a second follower transistor;
 a first switch coupled to said follower control terminal to turn off said follower transistor in response to a second mode-command signal; and
 a second switch inserted between said second follower transistor and said follower control terminal to extend said signal path through said second follower transistor in response to said mode-command signal and block said signal path in absence of said mode-command signal.

16. The amplifier of claim 6, further including a replica generator coupled to define a replica signal path to said current transistor in response to said mode command signal.

17. A buffer amplifier system that processes signals along a signal path, comprising:
 a follower transistor having a follower control terminal and a follower current terminal which define at least a portion of said signal path;
 a current transistor that provides a current to said follower current terminal;
 a switched-capacitor network that couples a capacitor to said follower current terminal in response to a first mode-command signal and decouples said capacitor in response to absence of said first mode-command signal; and a reset switch coupled to said follower current terminal to provide a discharge path for said capacitor in response to a second mode-command signal that precedes said first mode-command signal.

18. The amplifier of claim 17, further including:

a cascode transistor inserted between said follower current terminal and said current transistor; and a switch transistor inserted between said cascode transistor and said current transistor to couple said current transistor and said cascode transistor together in response to said first mode-command signal and isolate said current transistor from said cascode transistor in absence of said mode-command signal.

19. A signal converter system for converting an analog input signal into a corresponding digital code, the system comprising:

a buffer amplifier that includes:
  a) a follower transistor that passes said analog input signal along a signal path from a follower control terminal to a follower current terminal;
  b) a current transistor;
  c) a cascode transistor coupled to said follower current terminal; and
  d) a switch transistor positioned to couple said current transistor and said cascode transistor together in response to a mode-command signal to thereby provide a follower current with said cascode transistor and positioned to isolate said current transistor from said cascode transistor in absence of said mode-command signal; and at least two converter stages coupled in series to receive said analog input signal from said follower current terminal and each convert a respective portion of said analog input signal into a respective code portion of said digital code wherein at least one of said stages includes:
  a) an analog-to-digital converter that provides that stage's code portion; and
  b) a switched-capacitor network configured to process that stage's code portion into a residue signal for conversion by a subsequent one of said stages.

20. The system of claim 19, wherein:

said current transistor and said cascode transistor respectively have a current control terminal and a cascode control terminal and further including first and second capacitors respectively coupled to said current control terminal and said cascode control terminal to reduce feedthrough of said mode-command signal onto said follower current; and said switch transistor has first and second switch current terminals and further including first and second charge-exchange transistors respectively coupled to said first and second switch current terminals and activated by a second mode-command signal.

* * * * *